United States Patent [19]

Bouffard et al.

[11] Patent Number: 4,586,062
[45] Date of Patent: Apr. 29, 1986

[54] MICROCIRCUITS FORMED FROM SUBSTRATES OF ORGANIC QUASIUNIDIMENSIONAL CONDUCTORS

[75] Inventors: Serge J. H. Bouffard, Chatenay Malabry; Libéro Zuppiroli, Paris; Denis Jerome, Jouy en Josas, all of France; Klaus Bechgaard, Copenhague, Denmark

[73] Assignee: Centre National de la Recherche Scientifique, Paris, France

[21] Appl. No.: 468,673

[22] Filed: Feb. 22, 1983

[30] Foreign Application Priority Data

Feb. 23, 1982 [FR] France ................... 82 02954

[51] Int. Cl.⁴ ............. H01L 39/22; H01L 29/28; H01L 29/161; H01L 39/02
[52] U.S. Cl. ............................... 357/5; 357/8; 357/61; 357/80; 307/306
[58] Field of Search ............. 357/5, 80, 4, 6, 8, 357/61; 307/306; 427/62, 35

[56] References Cited

U.S. PATENT DOCUMENTS

| | | | |
|---|---|---|---|
| 3,476,617 | 11/1969 | Robinson | 357/74 |
| 4,011,574 | 3/1977 | Wang et al. | 357/5 |
| 4,245,161 | 1/1981 | Crowne | 357/8 |
| 4,368,479 | 1/1983 | Davis | 357/5 |

FOREIGN PATENT DOCUMENTS 2024592 11/1969 France .
2463512 3/1981 France ................... 357/5
8114291 7/1981 France .

OTHER PUBLICATIONS

*Scientific American* vol. 247 #1, Jul. 82, "Organic Superconductors" by Beckgaard.
Braslau, N.; Fabrication of Planar Josephson Junctions by Laser Irradiation IBM Technical Disclosure Bulletin, vol. 18, No. 11, Apr. 1976.
C. R. Acad. Sc. Paris, t. 291 (Oct. 6, 1980), Series B.-602 Cptes rendus. series A&B. Sciences Mathem. & Physique vol. 291 (1980) Oct., Paris, France.

*Primary Examiner*—Andrew J. James
*Assistant Examiner*—Mark Prenty
*Attorney, Agent, or Firm*—Cushman, Darby & Cushman

[57] ABSTRACT

Microcircuits composed of a plurality of alternating conducting and insulating regions are formed in a substrate of an organic quasi-unidimensional conductor such as $\Delta^{2,2}$ bi-4,5-dimethyl-1,3-diselenolylidene upon irradiation of the substrate with a precise beam of electrons having an energy of at least 1 keV, preferably at least 8 keV, which forms the insulating regions. When exposed to cryogenic temperatures the non-irradated conducting regions become super conducting. Using electron beam irradiations, sub-micronic resolution as low as 100 Å can be achieved. Microcircuits having Josephson junctions and superconducting quantum interference devices are described.

3 Claims, 1 Drawing Figure

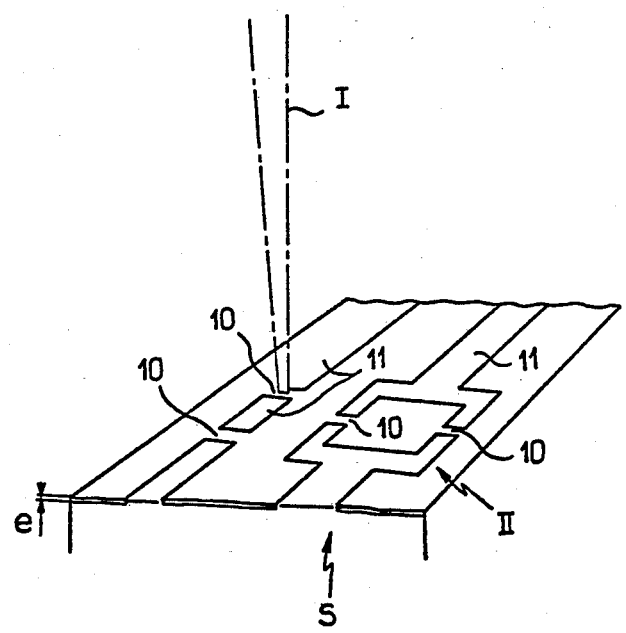

MICROCIRCUITS FORMED FROM SUBSTRATES OF ORGANIC QUASIUNIDIMENSIONAL CONDUCTORS

BACKGROUND OF THE INVENTION

The present invention relates generally to microcircuit design techniques and in particular to Josephson junction-type circuits.

The significant development of solid-state electronic microcomponents has recently led to the manufacture of ultra compact circuits using techniques known as large scale integration (L.S.I.) which allows the assembly of a few thousands active components, such as transistors, on a single silicon substrate. This technology has presently to face, in order to reach the next step of very large scale integration (V.L.S.I.), resolution problems for the manufacture of active patterns. Despite the progress made by microphotolithography, specially designing the mask through which exposure of various layers formed on the semi-conductor substrate is carried out, photomicrolithography hardly allows resolution below about the two microns despite theoretical statements announcing that resolutions of about half a micron can be obtained. Designing such masks is carried out by computer controlled electron beams. Once the mask is positioned, the sensitive layer is exposed to radiation or selectively subjected to chemical reaction. Some regions of a silicon layer can thus be selectively transformed into insulating portions by oxidizing silicon into silica.

The field of organic size conductors, and especially uni-dimensioned conductors, has been thoroughly investigated for some time, primarily by research groups to which the present inventors belong, especially as regards super-conducting properties, under certain conditions, of such conductors. The uni-dimensioned organic conductors conduct along one crystal direction only when above a certain temperature below which they are insulators. Low dimension conductors to which the present invention relates can be generically defined as materials showing an open Fermi surface. Quasi-unidimensional conductors (QID) and the alloys thereof specially have a quasi planar Fermi surface. It has thus been found that potentially superconducting organic conductors become insulators when a high transverse magnetic field is applied which field is of about a few Tesla. However, as soon as this magnetic field has been suppressed, the conductor instantaneously reverts to its electrical conducting state.

SUMMARY OF THE INVENTION

It is an object of the present invention to provide a microcircuit design process, and microcircuits so obtained, which circuits include a quasi-unidimensional conductor (QID) substrate on which conducting and insulating region patterns are selectively formed.

The present inventors have in fact found that, contrary to applying a magnetic field by irradiating the uni-dimensioned conductor with high energy particles, they irreversibly become insulators.

So, according to one feature of the present invention, in order to obtain a microcircuit of the above-mentioned type, the quasi-unidimensional conductor substrate is irradiated through predetermined regions by a fine beam of particles having an energy higher than or equal to 1 keV.

A similar finding has been made for some quasi-unidimensional conductors normally showing, at low temperatures, insulating properties and which, when irradiated under the same conditions, irreversibly acquire conducting properties at such low temperatures.

In the first case mentioned above, irradiation provides insulating regions having an insulator structure known as a disarranged structure, together with non-irradiated regions which retain their properties, and possibly their super-conducting properties at low temperatures.

In the second case, the quasi-unidimensional material having an insulator structure known as Peierls or Slater structure has its irradiated regions irreversibly becoming conducting.

Microcircuits obtained according to the process of the present invention are particularly useful in low temperature applications, from the temperature of liquid nitrogen (77° K.) and especially at very low temperatures, for making super conducting circuits using tunnel junctions of the Josephson type which are immediately obtainable by controlling the particle beam when forming conducting and insulating regions.

BRIEF DESCRIPTION OF THE DRAWINGS

Other objects and advantages of the present invention will be apparent in the following specification, with reference to the accompanying drawing in which:

The FIGURE diagrammatically shows how to directly make Josephson junctions on a quasi-unidimensional conducting substrate according to the process of the present invention.

The major portion of the quasi-unidimensional conductors includes organic conductors, although some of non-organic compounds exhibit similar features, as will be shown. Numerous organic conductors are known in the art, for example TTF-TCNQ, $(TTT)_2I_3$, TMTTF-TCNQ compounds and corresponding molecules thereof, in which selenium is substituted for sulfur. A particularly important category of the above-mentioned products includes the $(TMTSF)_2X$ family, where $\Delta^{2,2}$ Bi-4,5-dimethyl-1,3-diselenolylidene (TMTSF) is the organic molecule constituting the base element and X is an inorganic anion used to form a salt. X may be selected from the group consisting of $PF_6^-$, $AsF_6^-$, $SbF_6^-$, $TaF_6^-$, $ReO_4^-$ and $ClO_4^-$ or other monovalent anions. The last mentioned family of compounds all show super conduction properties at low temperatures, transition temperatures thereof being increased by reticulated compounds obtained through the process of the U.S. application Ser. No. 479,068 filed Mar. 22, 1983 (corresponding to French patent application No. 81/14291 of July 22, 1981) and now U.S. Pat. No. 4517121.

As mentioned above by irradiating these compounds with a fine beam of ionizing particles (X or Y rays), or with electrons having an energy higher than 1 keV, preferably higher than 8 keV, the regions thus irradiated irreversibly take a disarranged insulating structure which is maintained, for example when the compound temperature is lowered from the ambient temperature to the cryogenic temperature where the non irradiated regions become super conducting. One can obtain a sub-micronic resolution, which can be as low as 100 angstroms and thus form alternating conducting and insulating patterns on a crystalline substrate, or a polycrystalline or oriented film can be obtained, for example by surface evaporation.

The figure shows a manufacturing process for microcircuits where a computer controlled particle beam I is forming on substrate S surface an insulating region 10 interrupting a conducting strip 11 for making a Josephson tunnel junction. This process allows making serial Josephson junctions as shown in the left hand side of the FIGURE. In the right hand side of the FIGURE, a structure termed a Superconducting Quantum Interference Device ("SQUID") is shown as II, which is similarly obtained by beam scanning.

Implementing the techniques of the present invention results in microcircuits for use at cryogenic temperatures for implementing any technique employing the Josephson effect, for example for making detectors (by quasi-particular, non-linearity rectification), amplifiers (by magnetic modulation of SQUID critical current), logic gates or memories (by enclosing the information flow in superconducting loops). Generators, transductors or micrometric devices with Josephson junction networks can also be obtained.

Investigations have shown that structure changes due to the particle beam occur within a thickness e which depends on the incident particle energy. From 40 keV to 100 keV electrons provide a uniform change within a thicknesses of from 10 to 50 $\mu$m, respectively. The region thickness defining the boundary between a conducting region and an insulating region is about one micron, so that it is conceivable to make, through choice of irradiating means, engravings either on the whole thickness of the sample by using radiations having a sufficient initial energy, or on a portion of the thickness by limiting the initial energy of the particles. One can thus contemplate using tridimensional engraving technics as well as bi-dimensional ones.

In the practice of a technology using the Josephson effect, preferably $(TMTSF)_2ClO_4$ will be used, which becomes superconducting below 1.25° K. under atmospheric pressure. For the superconducting organic compound $(TMTSF)_2PF_6$ the superconducting transition temperature is below 1° K. under high pressure. The $(TMTSF)_2X$ series of compounds, however, show a precursor condition announcing the superconducting state as soon as temperatures lower than 40° K. are reached. Such precursor effects lead to a large increase of the low temperature conductibility. The following table shows, for the $(TMTSF)_2PF_6$ compound, penetrating thicknesses and critical doses in terms of millicoulombs per square centimeter for three typical energies of bombarding electrons, so that a 4° K. irradiated region resistivity is at least one thousand times as much as the original resistivity in the metallic condition at the same temperature at 4.2 K $\rho(\phi_C, 4.2\ K) \geq 1,000\rho$ (4.2 K). This relationship is true for the complete electron path.

TABLE

| Electron energy | $\phi$ C | Penetration depth |
| --- | --- | --- |
| 40 keV | 1 mC/cm$^2$ | 20 $\mu$m |
| 100 keV | 2 mC/cm$^2$ | 100 $\mu$m |
| 1 MeV | 4 mC/cm$^2$ | 4 mm |

As mentioned above, a similar behavior occurs for inorganic quasi-unidimensional superconductors such as NbSe$_3$. In this case, however, it is necessary to work with particle flows of several hundreds of keV, which penetrate several hundred microns of substrate. With NbSe$_3$, for example, a 300 mC/cm$^2$ dose (for 3 MeV energy electrons) is required to change from a very low resistivity state of 20 $\mu\Omega$.cm to a disarranged insulating state of 6.50 $\Omega$.cm.

In the second approach, where the irradiation forms conducting regions in a Peierls structure insulating substrate, compounds showing such insulating properties at low temperatures include TMTSF-DMTCNQ (DMTCNQ = 2,5-dimethyl-7,7'-8,8'-tetra-cyanoquino dimethane). This compound shows, for example, a $\rho$ 4.2 $\approx$ 10.4 $\Omega$.cm resistivity at 4.2° K. With a view to some parts of the crystalline compound passing, at said temperature, from this insulating state to a state which is 1,000 times as conducting as the previous one ($\rho$ ($\Phi$ C$_2$, 4.2) = 10$^4$ $\Omega$.cm), a 75 mC/cm$^2$ electron dose of 40 keV or a 3 mC/cm$^2$ electron dose of 1 MeV is sufficient.

While the above description constitutes the preferred embodiment of the invention, it will be appreciated that the invention is susceptible to modifications, variations and changes without departing from the proper scope and meaning of the appended claims.

Having thus described the invention, what I claim is:

1. A microcircuit for use at temperatures below 77° K. comprising a substrate comprising $\Delta^{2,2}$ bi-4,5-dimethyl-1,3-diselenolylidene-2,5-dimethyl-7,7'-8, 8'-tetra-cyanoquino dimethane, the substrate having an alternating pattern of superconducting regions and insulating regions thereon said superconducting and insulating regions forming a series of Josephson junctions.

2. The microcircuit of claim 1 in which the substrate comprises $\Delta^{2,2}$ bi-4,5-dimethyl-1,3-diselenolylidene chlorate.

3. The microcircuit claim 1 in which the substrate additionally includes non-organic compound.

* * * * *